United States Patent
Park et al.

(10) Patent No.: US 10,905,001 B2
(45) Date of Patent: Jan. 26, 2021

(54) ACCESSORY DEVICE COMPRISING PRINTED CIRCUIT BOARD HAVING FLEXIBLE STRUCTURE

(71) Applicant: Samsung Electronics Co., Ltd., Suwon-si (KR)

(72) Inventors: Seo-Yeon Park, Hwaseong-si (KR); Ki-Hyun Kim, Anyang-si (KR); Hyung-Wook Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/493,272

(22) PCT Filed: Jan. 25, 2018

(86) PCT No.: PCT/KR2018/001110
§ 371 (c)(1),
(2) Date: Sep. 11, 2019

(87) PCT Pub. No.: WO2018/174398
PCT Pub. Date: Sep. 27, 2018

(65) Prior Publication Data
US 2020/0037435 A1 Jan. 30, 2020

(30) Foreign Application Priority Data
Mar. 20, 2017 (KR) .......... 10-2017-0034913

(51) Int. Cl.
*H05K 7/00* (2006.01)
*H05K 1/02* (2006.01)
(Continued)

(52) U.S. Cl.
CPC .......... *H05K 1/028* (2013.01); *A45C 11/00* (2013.01); *H05K 1/147* (2013.01); *H05K 5/03* (2013.01);
(Continued)

(58) Field of Classification Search
USPC .......................................... 361/749
See application file for complete search history.

(56) References Cited

U.S. PATENT DOCUMENTS

2005/0237725 A1* 10/2005 Cho .............. H01R 35/02
361/752
2014/0376192 A1 12/2014 Park et al.
(Continued)

FOREIGN PATENT DOCUMENTS

JP H05-48218 A 2/1993
KR 10-1997-0014486 A 3/1997
(Continued)

OTHER PUBLICATIONS

ISA/KR, International Search Report and Written Opinion of the International Searching Authority, International Application No. PCT/KR2018/001110, dated May 2, 2018, 13 pages.
(Continued)

*Primary Examiner* — Andargie M Aychillhum

(57) ABSTRACT

An accessory device for covering an electronic device, according to various embodiments of the present invention, comprises: a cover part including a front cover for covering at least a part of the front side of the electronic device, a rear cover for covering at least a part of the rear side of the electronic device, and a side part for connecting the front cover and the rear cover; a first component arranged on the front cover; a second component arranged on the inner side of the rear cover; and a printed circuit board electrically connected to the first component and the second component and arranged from the front cover to the rear cover while traversing the side part, wherein at least part of the printed circuit board can include a flexible structure in the folding region of the cover part, corresponding to the movement of the front cover.

14 Claims, 12 Drawing Sheets

(51) Int. Cl.
*A45C 11/00* (2006.01)
*H05K 1/14* (2006.01)
*H05K 5/03* (2006.01)

(52) U.S. Cl.
CPC ... *A45C 2011/002* (2013.01); *A45C 2011/003* (2013.01); *H05K 2201/05* (2013.01)

(56) References Cited

U.S. PATENT DOCUMENTS

| | | | |
|---|---|---|---|
| 2015/0155903 A1* | 6/2015 | Jang | H04M 1/04 455/575.8 |
| 2016/0197637 A1 | 7/2016 | Lee et al. | |
| 2017/0079592 A1 | 3/2017 | Park et al. | |

FOREIGN PATENT DOCUMENTS

| | | |
|---|---|---|
| KR | 10-2005-0102191 A | 10/2005 |
| KR | 10-2012-0096244 A | 8/2012 |
| KR | 10-2015-0020997 A | 2/2015 |
| KR | 10-2015-0064945 A | 6/2015 |
| KR | 10-2015-0081525 A | 7/2015 |
| KR | 10-2015-0109135 A | 10/2015 |
| KR | 10-2016-0084723 A | 7/2016 |

OTHER PUBLICATIONS

Supplementary European Search Report in connection with European Application No. 18772087.5 dated Dec. 18, 2019, 7 pages.

\* cited by examiner

ACCESSORY DEVICE COMPRISING PRINTED CIRCUIT BOARD HAVING FLEXIBLE STRUCTURE

CROSS-REFERENCE TO RELATED APPLICATIONS

This application is a National Phase Entry of PCT International Application No. PCT/KR2018/001110, which was filed on Jan. 25, 2018 and claims priority under 35 U.S.C. § 119 of Korean Patent Application No. 10-2017-0034913, filed on Mar. 20, 2017, in the Korean Intellectual Property Office the disclosure of which is incorporated herein by reference in its entirety.

BACKGROUND

1. Field

Various embodiments of the present invention relate to accessory devices to cover electronic devices, e.g., accessory devices with a flexible printed circuit board.

2. Description of Related Art

Advancing information communication and semiconductor technologies accelerate the spread and use of various electronic devices. In particular, recent electronic devices are being developed to carry out communication while carried.

For example, smartphones, personal computers, tablet PCs, or other electronic devices provide useful functions to users via various applications. Recent trends are that electronic devices are evolving to devices capable of taking advantage of various types of information, as well as voice call functionality, by providing various functions.

There have been developed accessory devices which are connected with electronic devices to perform some of the functions of the electronic devices to be used along with the electronic devices. For example, various accessory devices include protection covers for protecting electronic devices, docks for mounting electronic devices, or chargers for charging electronic devices.

SUMMARY

An accessory device coupled with an electronic device (e.g., a portable terminal) may have a cover part and a display device. A flexible printed circuit board placed inside the accessory device is formed in a straight structure and may easily be open-circuited by constant stress or strong external tension.

According to various embodiments of the present invention, an accessory device to cover an electronic device is designed to have a printed circuit board formed in a curved shape where it is bent to withstand constant stress or strong external tension.

According to various embodiments of the present invention, a cover part of an accessory device to cover an electronic device is formed of fabric and/or leather which is extendable, and there is implemented a printed circuit board structure which may correspond to the extendable nature of the cover part.

According to various embodiments of the present invention, an accessory device to cover an electronic device is designed to have multiple bending structures in a bent portion of a printed circuit board so that despite disconnection of one of its lines, it may stay in normal operation with the remaining lines.

According to various embodiments of the present invention, an accessory device for covering an electronic device comprises a cover part including a front cover configured to cover at least part of a front surface of the electronic device, a rear cover configured to cover at least part of a rear surface of the electronic device, and a side part connecting the front cover and the rear cover, a first component disposed on the front cover, a second component disposed inside the rear cover, and a printed circuit board electrically connected with the first component and the second component and disposed from the front cover through the side part to the rear cover, wherein at least a portion of the printed circuit board may include a bending structure in a folding area of the cover part corresponding to a movement of the front cover.

According to various embodiments of the present invention, an accessory device for covering an electronic device comprises a cover part including a front cover configured to cover at least part of a front surface of the electronic device, a rear cover configured to cover at least part of a rear surface of the electronic device, and a side part extending from the front cover and connecting the rear cover and a printed circuit board disposed inside the cover part and formed from the front cover through the side part to the rear cover, wherein a length of the printed circuit board positioned in the side part may be larger than a width of the side part.

According to various embodiments of the present invention, an electronic device including an accessory device comprises a first electronic device including a display, a cover part including a front cover configured to cover at least part of a front surface of the display of the first electronic device, a rear cover configured to cover at least part of a rear surface of the first electronic device, and a side part surrounding a portion of a space between the front cover and the rear cover, and a printed circuit board disposed from the front cover through the side part to the rear cover, wherein the front cover of the cover part may be rotated on the rear cover through a virtual folding line formed in the side part to open or close the display, and wherein at least part of the printed circuit board is disposed to be parallel with a direction of stress applied to the side part along the virtual folding line.

According to various embodiments of the present invention, the printed circuit board inside the cover of the accessory device to cover an electronic device is designed to have a curved shape in its bent portion and, thus, may withstand constant stress or strong external tension.

According to various embodiments of the present invention, the accessory device to cover an electronic device may implement a printed circuit board structure in a curved shape which may correspond to the extendable nature of the cover formed of fabric and/or leather.

According to various embodiments of the present invention, the accessory device to cover an electronic device is designed to have a plurality of printed circuit boards pass where the printed circuit board is bent so that it may remain in normal operation although some lines are disconnected.

DETAILED DESCRIPTION

Figure 1:
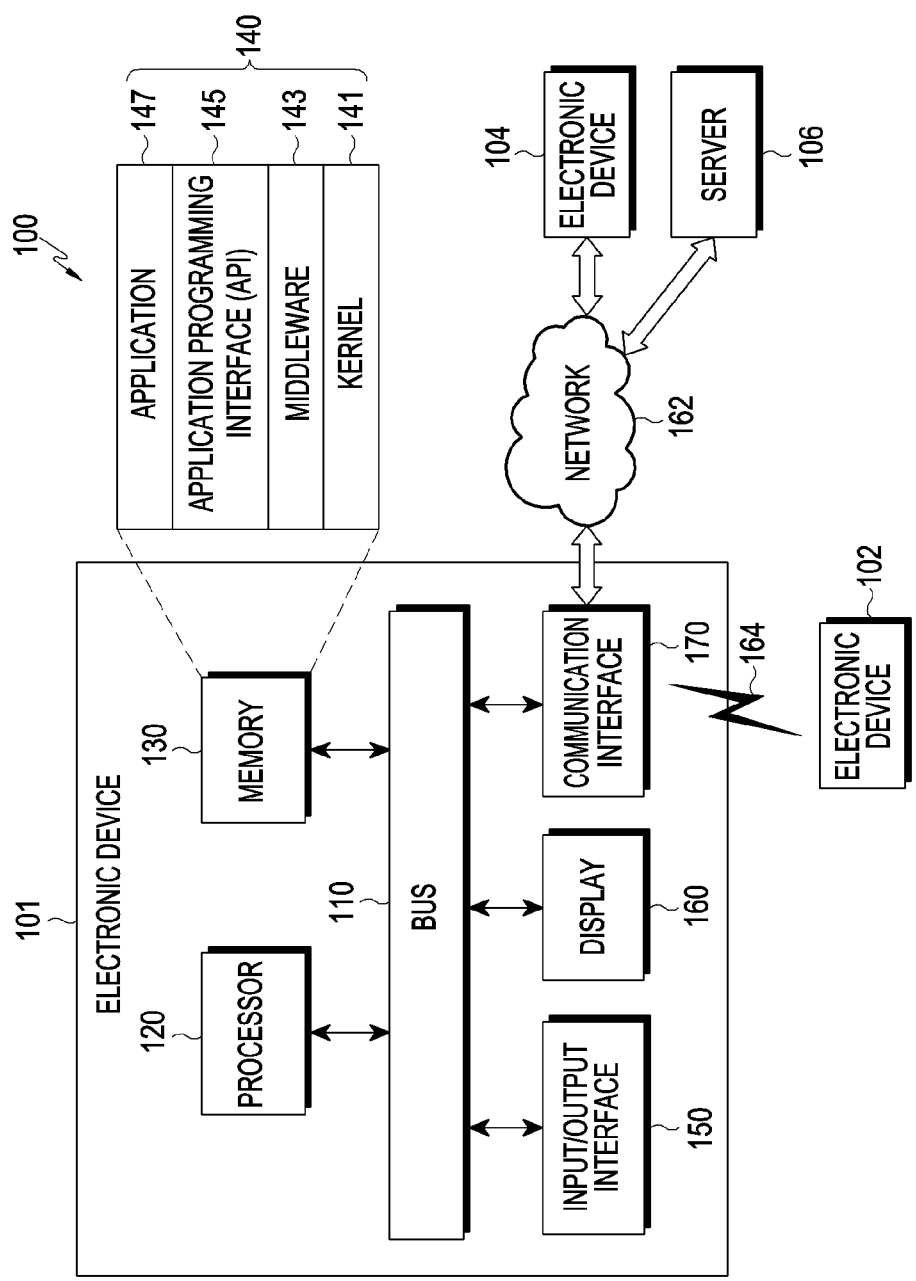
FIG. 1 depicts an electronic device 101 in a network environment 100 according to an embodiment of the present invention.

Hereinafter, embodiments of the present disclosure are described with reference to the accompanying drawings. However, it should be appreciated that the present disclosure is not limited to the embodiments and all changes and/or equivalents or replacements thereto also belong to the scope of the present disclosure. The same or similar reference denotations may be used to refer to the same or similar elements throughout the specification and the drawings.

As used herein, the terms "have," "may have," "include," or "may include" a feature (e.g., a number, function, operation, or a component such as a part) indicate the existence of the feature and do not exclude the existence of other features.

As used herein, the terms "A or B," "at least one of A and/or B," or "one or more of A and/or B" may include all possible combinations of A and B. For example, "A or B," "at least one of A and B," "at least one of A or B" may indicate all of (1) including at least one A, (2) including at least one B, or (3) including at least one A and at least one B.

As used herein, the terms "first" and "second" may modify various components regardless of importance and/or order and are used to distinguish a component from another without limiting the components. For example, a first user device and a second user device may indicate different user devices from each other regardless of the order or importance of the devices. For example, a first component may be denoted a second component, and vice versa without departing from the scope of the present disclosure.

It will be understood that when an element (e.g., a first element) is referred to as being (operatively or communicatively) "coupled with/to," or "connected with/to" another element (e.g., a second element can be coupled or connected with/to the other element directly or via a third element. In contrast, it will be understood that when an element (e.g., a first element) is referred to as being "directly coupled with/to" or "directly connected with/to" another element (e.g., a second element), no other element (e.g., a third element) intervenes between the element and the other element.

As used herein, the terms "configured (or set) to" may be interchangeably used with the terms "suitable for," "having the capacity to," "designed to," "adapted to," "made to," or "capable of" depending on circumstances. The term "configured (or s" does not essentially mean "specifically designed in hardware to." Rather, the term "configured to" may mean that a device can perform an operation together with another device or parts. For example, the term "processor configured (or set) to perform A, B, and C" may mean a generic-purpose processor (e.g., a CPU or application processor) that may perform the operations by executing one or more software programs stored in a memory device or a dedicated processor (e.g., an embedded processor) for performing the operations.

The terms as used herein are provided merely to describe some embodiments thereof, but not to limit the scope of other embodiments of the present disclosure. It is to be understood that the singular forms "a," "an," and "the" include plural references unless the context clearly dictates otherwise. The terms including technical and scientific terms used herein have the same meaning as commonly understood by one of ordinary skill in the art to which the embodiments of the present disclosure belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some cases, the terms defined herein may be interpreted to exclude embodiments of the present disclosure.

For example, examples of the electronic device according to various embodiments may include at least one of a smartphone, a tablet personal computer (PC), a mobile phone, a video phone, an e-book reader, a desktop PC, a laptop computer, a netbook computer, a workstation, a server, a personal digital assistant (PDA), a portable multimedia player (PMP), an MP3 player, a mobile medical device, a camera, or a wearable device. According to various embodiments, the wearable device may include at least one of an accessory-type device e.g., a watch, a ring, a bracelet, an anklet, a necklace, glasses, contact lenses, or a head-mounted device (HMD)), a fabric- or clothes-integrated device (e.g., electronic clothes), a body attaching-type device (e.g., a skin pad or tattoo), or a body implantable device (e.g., an implantable circuit).

According to some embodiments, the electronic device may be a home appliance. Examples of the home appliance may include at least one of a television, a digital video disk (DVD) player, an audio player, a refrigerator, an air conditioner, a cleaner, an oven, a microwave oven, a washer, a drier, an air cleaner, a set-top box, a home automation control panel, a security control panel, a TV box (e.g., Samsung HomeSync™, Apple TV™, or Google TV™), a gaming console (Xbox™, PlayStation™), an electronic dictionary, an electronic key, a camcorder, or an electronic picture frame.

According to other embodiments, examples of the electronic device may include at least one of various medical devices (e.g., diverse portable medical measuring devices (a blood sugar measuring device, a heartbeat measuring device, or a body temperature measuring device), a magnetic resource angiography (MRA) device, a magnetic resource imaging (MRI) device, a computed tomography (CT) device, an imaging device, or an ultrasonic device), a navigation device, a global navigation satellite system (GNSS) receiver, an event data recorder (EDR), a flight data recorder (FDR), an automotive infotainment device, a sailing electronic device (e.g., a sailing navigation device or a gyro compass), avionics, security devices, vehicular head units, industrial or home robots, automatic teller's machines (ATMs), point of sales (POS) devices, or internet of things (IoT) devices (e.g., a bulb, various sensors, an electric or gas meter, a sprinkler, a fire alarm, a thermostat, a street light, a toaster, fitness equipment, a hot water tank, a heater, or a boiler).

According to some embodiments, examples of the electronic device may at least one of part of a piece of furniture or building/structure, an electronic board, an electronic signature receiving device, a projector, or various measurement devices (e.g., devices for measuring water, electricity, gas, or electromagnetic waves). According to various embodiments, the electronic device may be one or a combination of the above-listed devices. According to some embodiments, the electronic device may be a flexible electronic device. The electronic device disclosed herein is not limited to the above-listed devices, and may include new electronic devices depending on the development of technology.

Hereinafter, electronic devices are described with reference to the accompanying drawings, according to various embodiments. As used herein, the term "user" may denote a person or electronic device using an electronic device or accessory device, which is described below, or a device (e.g., an artificial intelligence electronic device) using the accessory device.

Referring to FIG. 1, according to an embodiment of the present disclosure, an electronic device 100 is included in a network environment 101. The electronic device 101 may include a bus 110, a processor 120, a memory 130, an input/output interface 150, a display 160, and a communication interface 170. In some embodiments, the electronic device 101 may exclude at least one of the components or may add another component. The bus 110 may include a circuit for connecting the components 110 to 170 with one another and transferring communications (e.g., control messages or data) between the components. The processor 120 may include one or more of a central processing unit (CPU), an application processor (AP), or a communication processor (CP). The processor 120 may perform control on at least one of the other components of the electronic device 101, or perform an operation or data processing relating to communication.

The memory 130 may include a volatile or non-volatile memory. For example, the memory 130 may store commands or data related to at least one other component of the electronic device 101. According to an embodiment of the present disclosure, the memory 130 may store software or a program 140. The program 140 may include, e.g., a kernel 141, middleware 143, an application programming interface (API) 145, or an application program (or "application") 147.

At least a portion of the kernel 141, middleware 143, or API 145 may be denoted an operating system (OS). For example, the kernel 141 may control or manage system resources (e.g., the bus 110, processor 120, or a memory 130) used to perform operations or functions implemented in other programs (e.g., the middleware 143, API 145, or application program 147). The kernel 141 may provide an interface that allows the middleware 143, the API 145, or the application 147 to access the individual components of the electronic device 101 to control or manage the system resources.

The middleware 143 may function as a relay to allow the API 145 or the application 147 to communicate data with the kernel 141, for example. Further, the middleware 143 may process one or more task requests received from the application program 147 in order of priority. For example, the middleware 143 may assign a priority of using system resources (e.g., bus 110, processor 120, or memory 130) of the electronic device 101 to at least one of the application programs 147 and process one or more task requests. The API 145 is an interface allowing the application 147 to control functions provided from the kernel 141 or the middleware 143. For example, the API 133 may include at least one interface or function (e.g., a command) for filing control, window control, image processing or text control. For example, the input/output interface 150 may transfer commands or data input from the user or other external device to other component(s) of the electronic device 101 or may output commands or data received from other component(s) of the electronic device 101 to the user or other external devices.

The display 160 may include, e.g., a liquid crystal display (LCD), a light emitting diode (LED) display, an organic light emitting diode (OLED) display, or a microelectromechanical systems (MEMS) display, or an electronic paper display. The display 160 may display, e.g., various content (e.g., text, images, videos, icons, or symbols) to the user. The display 160 may include a touchscreen and may receive, e.g., a touch, gesture, proximity or hovering input using an electronic pen or a body portion of the user. For example, the communication interface 170 may set up communication between the electronic device 101 and an external electronic device (e.g., a first electronic device 102, a second electronic device 104, or a server 106). For example, the communication interface 170 may be connected with the network 162 through wireless or wired communication to communicate with the external electronic device.

The wireless communication may include cellular communication which uses at least one e.g., long term evolution (LTE), long term evolution-advanced (LTE-A), code division multiple access (CDMA), wideband code division multiple access (WCDMA), universal mobile telecommunication system (UMTS), wireless broadband (WiBro), or global system for mobile communication (GSM). According to an embodiment, the wireless communication may include at least one of, e.g., wireless-fidelity (Wi-Fi), (Li-Fi), Bluetooth, Bluetooth low power (BLE), ZigBee, near-field communication (NFC), magnetic secure transmission (MST), radio frequency (RF), or body area network (BAN) as denoted with element 164 of FIG. 1. According to an embodiment of the disclosure, the wireless communication may include global navigation satellite system (GNSS). The GNSS may be, e.g., global positioning system (GPS), global navigation satellite system (Glonass), Beidou navigation satellite system (hereinafter, "Beidou") or Galileo, or the European global satellite-based navigation system. Hereinafter, the terms "GPS" and the "GNSS" may be interchangeably used herein. The wired connection may include at least one of, e.g., universal serial bus (USB), high definition multimedia interface (HDMI) recommended standard (RS)-232, power line communication (PLC), or plain old telephone service (POTS). The network 162 may include at least one of telecommunication networks, e.g., a computer network (e.g., local area network (LAN) or wide area network (WAN)), Internet, or a telephone network.

The first and second external electronic devices 102 and 104 each may be a device of the same or a different type from the electronic device 101. According to an embodiment of the present disclosure, all or some of operations executed on the electronic device 101 may be executed on another or multiple other electronic devices (e.g., the electronic devices 102 and 104 or server 106). According to an embodiment of the present disclosure, when the electronic device 101 should perform some function or service automatically or at a request, the electronic device 101, instead of executing the function or service on its own or additionally, may request another device (e.g., electronic devices 102 and 104 or server 106) to perform at least some functions associated therewith. The other electronic device (e.g., electronic devices 102 and 104 or server 106) may execute the requested functions or additional functions and transfer a result of the execution to the electronic device 101. The electronic device 101 may provide a requested function or service by processing the received result as it is or additionally. To that end, a cloud computing, distributed computing, or client-server computing technology may be used, for example.

According to an embodiment, the communication interface may include an NFC module. The NFC module may transmit or receive signals via the NFC antenna 164 using a short-range wireless communication protocol (e.g., an NFC protocol). For example, the NFC module 164 may transfer an authentication request signal to an electronic device 102, e.g., the accessory device 200 of FIG. 2 and receive an authentication response signal from the accessory device 200. If authentication with the accessory device 200 is complete, the NFC module may enter a first mode (e.g., a reader mode) when an event occurs and transfer first radio frequency (RF) signals through the NFC antenna 164 to the accessory device 200 during a first time period. The NFC module may periodically transfer event identification signals (e.g., polling signals) through the NFC antenna 164 to the accessory device 200 to identify events occurring in the accessory device 200. The NFC module may receive second radio frequency (RF) signals containing responses to the event identification signals from the accessory device 200 through the NFC antenna 164.

According to an embodiment, if sensing the presence of an external electronic device at, at least, one selected time point during the first time period, the NFC module may switch into a second mode (e.g., a card emulation mode) to allow the external electronic device to read data from the NFC module. According to an embodiment, unless sensing the presence of an external electronic device in a standby mode, the NFC module may switch into the first mode to perform power transmission to the accessory device 200.

Figure 2:
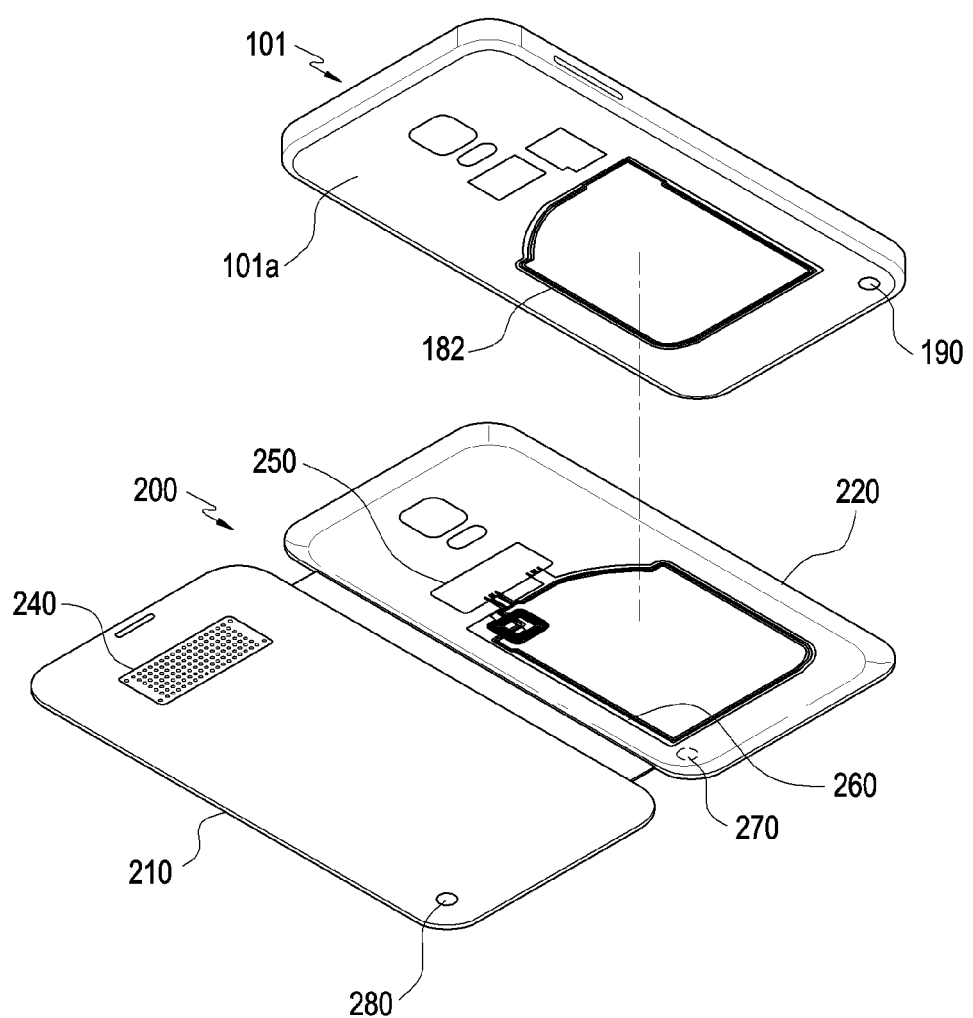
FIG. 2 is a perspective view illustrating an arrangement between an electronic device 101 and an accessory device 200 according to an embodiment of the present invention.

FIG. 2 is a perspective view illustrating an arrangement between an electronic device 101 and an accessory device 200 according to an embodiment of the present invention.

The structure of the electronic device 101 of FIG. 2 may be the same in whole or part as the structure of the electronic device 101 of FIG. 1. The structure of the accessory device 200 of FIG. 2 may be the same in whole or part as the structure of the electronic devices 102 and 104 of FIG. 1.

Referring to FIG. 2, the electronic device 101 and the accessory device 200 may be electrically connected with each other via wireless communication. The accessory device 200 may have a display device 240 to display data. The electronic device 101 may include a portable mobile device, and the accessory device 200 may be a protection cover of the electronic device 101. For example, the protection cover may include a front cover part 210 and a rear cover part 220 to cover the front and rear surface of the electronic device.

According to various embodiments, a processor (e.g., the processor 120 of FIG. 1) may perform authentication with the accessory device 200 upon receiving an authentication response signal from the accessory device 200 in response to an authentication request signal. In a case where as a result of authentication, the accessory device 200 is allowable (or genuine), the processor 120 may determine whether the front cover part 210 of the accessory device 200 is in open state or closed state and may determine whether an event to supply power occurs. For example, the processor 120 may include at least one sensor to sense whether the electronic device 101 is attached or detached to/from the accessory device 200 and whether the front cover part is open or closed through a sensor module disposed in the electronic device 101.

According to various embodiments, if the rear surface of the electronic device 101 contacts the rear cover part 220 of the accessory device 200, the electronic device 101 may sense at least one first sensing member 270 disposed on one surface of the rear cover part 220 of the accessory device 200 to sense whether the accessory device 200 is coupled to the electronic device 101. The first sensing member 270 may be provided in a position corresponding to the sensor module 190. The sensor module 190 may sense whether the accessory device 200 is coupled to the electronic device 101 and, if sensing coupling of the accessory device 200 to the electronic device 101, transfer a sensing signal to the processor 120.

According to various embodiments, if the front surface of the electronic device 101 contacts the front cover part 210 of the accessory device 200, the electronic device 101 may sense at least one second sensing member 280 disposed on one surface of the front cover part 210 of the accessory device 200 to sense whether the front cover part 210 of the accessory device 200 is open or closed. For example, upon sensing the second sensing member 280 through a sensor module (not shown) positioned on the front surface of the electronic device, the electronic device 101 may determine that the front cover part 210 is closed and, if the second sensing member 280 is not sensed, determine that the front cover part 210 is open. For example, upon sensing opening of the front cover part while transferring power to the accessory device 200, the electronic device 101 may stop transfer of power to the accessory device 200.

According to various embodiments, the first and second sensing members 270 and 280 may be, e.g., magnets, magnetic materials, or contact protrusions. In a case where the first and second sensing members 270 and 280 are magnets or magnetic materials, the sensor module 190 may be a sensor capable of sensing magnets or magnetic materials. In a case where the first and second sensing members 270 and 280 are contact protrusions, the sensor module 190 may be a sensor capable of sensing contact of a contact protrusion.

According to various embodiments, the electronic device 101 and the accessory device 200 may perform authentication on each other using a short-range communication scheme, such as an NFC communication scheme or RFID communication scheme. In a case where the accessory device 200 is allowed as a result of authentication, the electronic device 101 may enter a preset mode (e.g., a reader mode) in which it may read or write particular information during a predetermined time period when an event to display data occurs, transferring power and data to the accessory device 200. For example, the reader mode may be an operation mode in which if an NFC card (e.g., an NFC tag) is recognized (or authenticated) particular information may be written or read. The reader mode may be an operation mode in which if the accessory device 200 is recognized (or authenticated), power and data may be transferred to the accessory device 200 or data may be received from the accessory device 200.

According to various embodiments, when coupled with the electronic device 101, the accessory device 200 may perform authentication with the electronic device 101 and, if authentication is complete, it may be deactivated. Upon receiving power and data related to an occurring event from the electronic device 101, the accessory device 200 may be activated and display information regarding the event occurring in the electronic device 101 using the received data.

According to various embodiments, the electronic device 101 may determine whether the presence of an external electronic device is sensed at at least one selected time point during a predetermined time period. For example, the electronic device 101 may transfer a request signal for sensing the presence of an external electronic device at at least one selected time point to the accessory device 200. Upon receiving no response signal or a response signal containing error data from the accessory device 200 during a preset time, the electronic device 200 may sense that there is no external electronic device.

According to various embodiments, upon sensing the presence of the external electronic device, the electronic device 101 may switch into a particular mode (e.g., a card emulation mode) to allow the data of the electronic device 101 to be read during a predetermined time period. The data may contain payment-related information (e.g., information necessary for electronic payment). The card emulation mode may be an operation mode to allow the external electronic device to read the data of the electronic device. For example, the particular mode may be a peer-to-peer (P2P) mode of an NFC protocol. For example, upon sensing the presence of the external electronic device, the electronic device 101 may stop transmission of power to the accessory device 200 and allow the external electronic device to read the data of the electronic device 101.

According to various embodiments, if the electronic device 101 searches for an external electronic device and an external electronic device is discovered while transmitting power to the accessory device 200, the electronic device 101 may stop transmission of power to the accessory device 200 and perform communication connection with the external electronic device and a particular operation. If the operation with the external electronic device is complete, the electronic device 101 may switch into a standby mode (or standby state) or, if transmission of power to the accessory device 200 is incomplete, resume transmission of power to the accessory device 200. The standby mode may be an operation mode in which it waits for a particular time period to sense the presence of at least one external electronic device.

Figure 3:
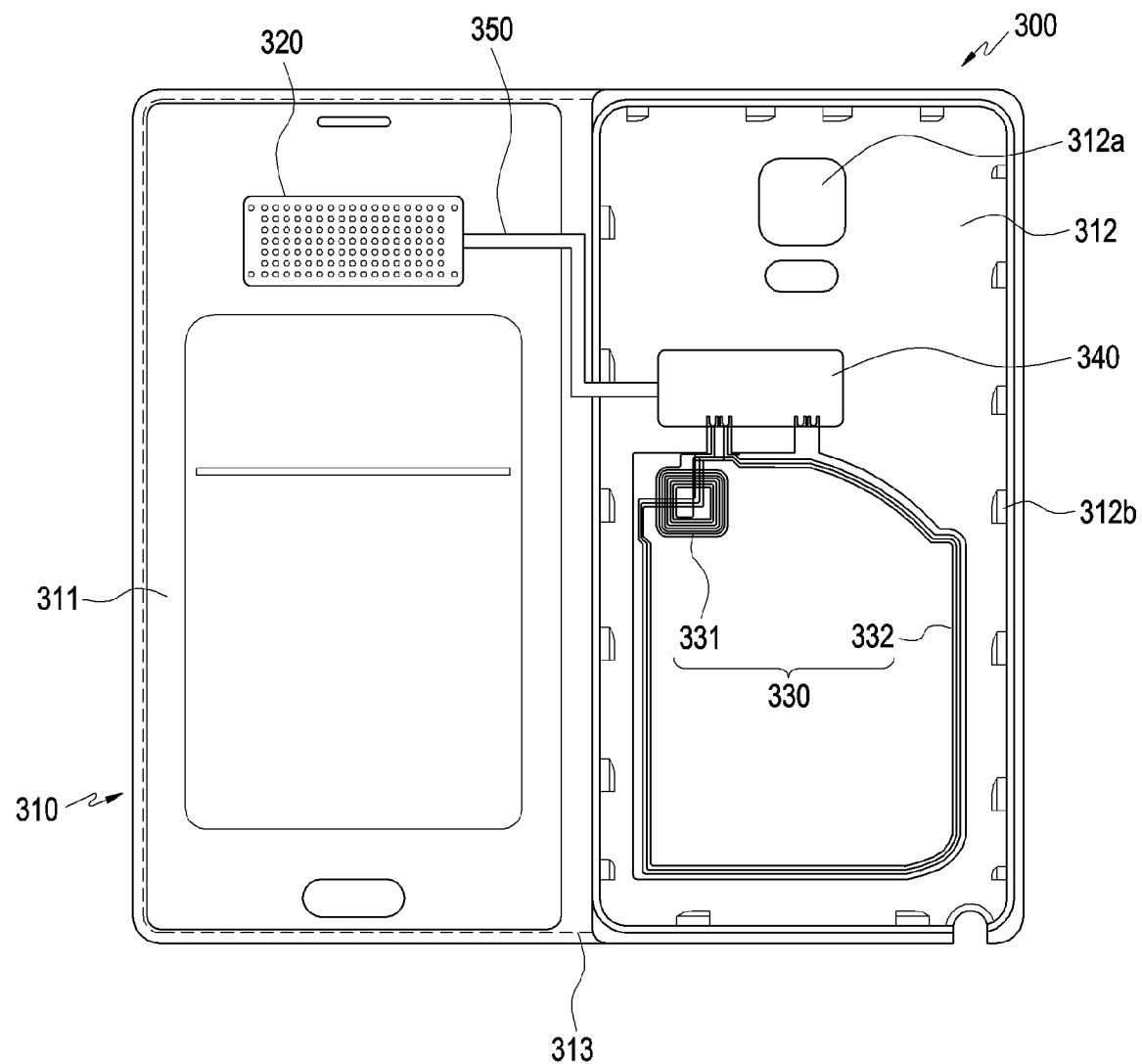
FIG. 3 is a plan view illustrating an unfolding accessory device 300 according to various embodiments of the present invention.
Figure 4:
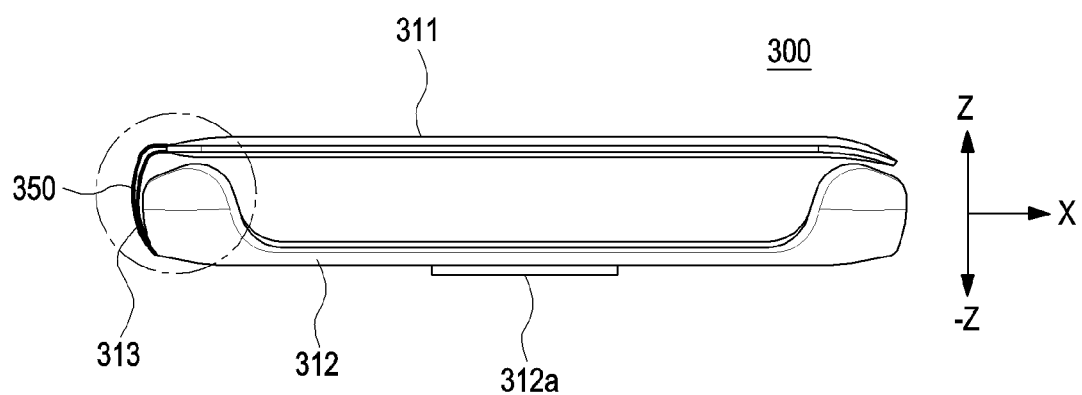
FIG. 4 is a side view illustrating an accessory device 300 in a folding state according to various embodiments of the present invention.

FIG. 3 is a plan view illustrating an unfolding accessory device 300 according to various embodiments of the present invention. FIG. 4 is a side view illustrating an accessory device 300 in a folding state according to various embodiments of the present invention.

The structure of the accessory device 300 of FIGS. 3 and 4 may be the same in whole or part as the structure of the accessory device 200 of FIG. 2 or the electronic devices 102 and 104 of FIG. 1.

Referring to FIGS. 3 and 4, the accessory device 300 may include a cover part 310. The cover part 310 may include a first surface 311 corresponding to the front surface, a second surface 312 corresponding to the rear surface, and a third surface 313 surrounding part of a space between the first surface 311 and the second surface 312.

According to various embodiments, the accessory device 300 may be a protection cover of an electronic device (e.g., the electronic device 101 of FIG. 1). For example, the first surface 311 may cover at least part of the front surface of the electronic device 101, and the second surface 312 may cover at least part of the rear surface of the electronic device 101. The third surface 313 may connect the first surface 311 and the second surface 312. As another example, the second surface 312 may be coupled to the electronic device 101, and the first surface 311 may open or close the front surface of the electronic device while rotating on the second surface 312 through the third surface 313.

According to various embodiments, a first component may be disposed on part of the first surface 311, and a second component may be disposed inside the second surface 312. The first component may include, e.g., an output device, an antenna, and/or a control module, and the output device may be, e.g., a speaker to deliver sound waves or a display device 320. As another example, the second component may be placed in part of the inside of the second surface 312. The second component may include a device to receive (or process) signals from another electronic device. For example, at least one antenna 330 or a control module 340 may be disposed. A signal received and/or processed by the second component may include a power signal. A sensing module (not shown) may further be placed in part of the inside of the second surface 312. As another example, the second surface 312 may have a hole 312a to allow the camera module or fingerprint scanning module (not shown) provided on the rear surface of the electronic device 101 to be exposed through the second surface 312.

According to various embodiments, the accessory device 300 may include a connecting member 312b to allow the second surface 312 of the cover part 310 to detachably contact the electronic device 101. One or more connecting members 312b may be configured on at least part of the second surface 312.

According to various embodiments, at least one antenna 330 may be disposed inside the second surface 312 to transmit or receive electric signals to/from the electronic device (e.g., the electronic device 101 of FIG. 1). For example, a first antenna 331 may be positioned which is a first conductive pattern to receive data of a radio frequency (RF) signal of the electronic device 101. As another example, a second antenna 332 which is a second conductive pattern to receive power of a first radio frequency (RF) from the electronic device 101 and is electrically separated from the first antenna 331 may be positioned inside the second surface 312.

According to various embodiments, a control module 340 which is electrically connected with the first antenna 331 and the second antenna 332 and receives radio frequency (RF) signals or transmits response signals through the first antenna 331 or transfer power to the display device 320 may be positioned inside the second surface 312 of the cover part 310. The control module 340 may be electrically connected with the display device 320 and drive the display device 320.

According to various embodiments, a printed circuit board 350 may be positioned inside the cover part 310 to electrically connect the first component and the second component. For example, the printed circuit board 350 may connect power or signals received from the second component to the first component. In the following description, the first component and the second component are the display device 320 and the control module 340, respectively, as an example. The printed circuit board 350 may be disposed over the first surface 311, the second surface 312, and the third surface 313 and may be a flexible printed circuit board.

Referring back to FIG. 4, the first surface 311 may face the second surface 312 or its position may be flexibly varied. The first surface 311 of the cover part 310 may be folded on the second surface 312 along a virtual folding line which corresponds to the lengthwise direction of the third surface 313.

For example, the first and third surfaces 311 and 313 may be folded on the second surface 312 with respect to the virtual border line formed at the border between the second and third surfaces 312 and 313, and the third surface 313 may have folding lines partially bent.

In the folded state of the accessory device 300, the first surface 311 of the cover part 310 may be positioned to face in a first direction +Z, and the second surface 312 may be positioned to face in a second direction −Z which is opposite to the first direction +Z. The third surface 313 may be positioned to face a side surface of the cover part 310.

Figure 5:
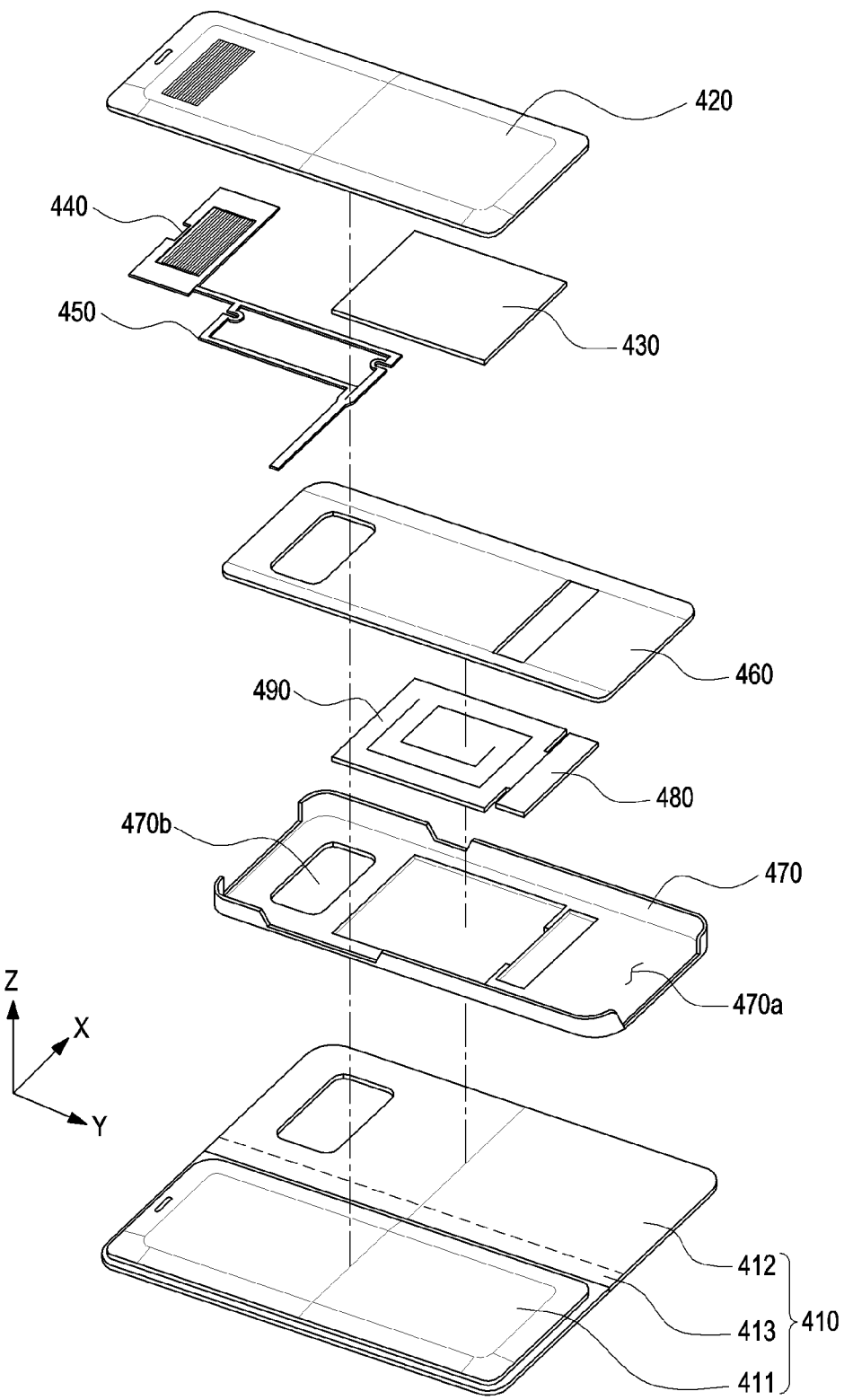
FIG. 5 is an exploded perspective view illustrating parts of an accessory device 400 according to various embodiments of the present invention.

FIG. 5 is an exploded perspective view illustrating parts of an accessory device 400 according to various embodiments of the present invention.

Referring to FIG. 5, the accessory device 400 may include a base 410, a cover part including cradles 420, a printed circuit board 450 and an antenna module 490 disposed inside the cover part, and a control module 480.

According to various embodiments, the cover of the accessory device 400 may include the base 410 which may fold and unfold about the center of the lengthwise direction, and the base 410 may include a first area 411 where the display device 440 is disposed and a second area 412 where an electronic device (e.g., the electronic device 101 of FIG. 2) is seated. As another example, a third area 413 may be included between the first area 411 and the second area 412.

According to various embodiments, in the folding and/or unfolding state of the accessory device 400, the first area 411 of the base 410 may be at least part of a first surface (e.g., the first surface 311 of FIG. 3) of the cover part (e.g., the cover part 310 of FIG. 3), and the second area 412 may be at least part of a second surface (e.g., the second surface 312 of FIG. 3) of the cover part. The third area 413 may be at least part of a third surface (e.g., the third surface 313 of FIG. 3). The base 410 may be seamlessly formed of a single material, e.g., plastic, leather, and/or fabric. As another example, the third area 413 may be formed of a relatively smooth material as compared with the first area 411 or the second area 412 to have a folding line or border line along which the second area 412 is rotatable on the first area 411.

According to various embodiments, at least one plate 430, a first cradle 420, a display device 440, and a printed circuit board 450 may be stacked on one surface of the first area 411 of the base 410. The plate 430 may be formed to support the printed circuit board 450. The first cradle 420 may be injection-molded to support the overall first surface (the first surface 311 of FIG. 3) of the accessory device 400 in a shape corresponding to the first area 411 of the base 410.

According to various embodiments, the display device 440 which is electrically connected with the control module 480 and is driven by the control module 480 may be positioned in an upper portion of the first cradle 420. The display device 440 may be electrically connected with the control module through the printed circuit board 450 and display data through the control module. The control module 480 may be disposed in a portion of the first cradle 420 and/or a portion of the second cradle 470 and, upon receiving a signal including power and/or data through at least one antenna, extract the power and/or data from the signal. The control module 480 may transfer the extracted power to the display device 440, activating the display device 440. For example, the control module positioned in the first cradle 420 may be provided with a signal, which is received through the antenna module 490, through the printed circuit board 450 and extract power and/or data, activating the display device 440. As another example, the control module positioned in the second cradle 470 may be provided with a signal, which is received through the antenna module 490, through the printed circuit board 450 and extract power and/or data, activating the display device 440.

According to various embodiments, the display device 440 may be activated with power received from the control module 480 and may be operated (or functioned) based on data received from the control module 480. For example, the display device 440 may display information about an event using data (e.g., characters, numbers, symbols, or emoticons) received from the electronic device (the electronic device 101 of FIG. 2) or may display information reflecting at least one of a dimming effect, an animation effect, and move-up, move-down, move-left, or move-right effect during a preset time. For example, the data may include an image for display, an effect to be applied to the image, or a time during which the image is displayed.

According to various embodiments, the display device 440 may include multiple light emitting elements. The light emitting elements may be included in various forms (e.g., a matrix form) in the display device 440. For example, the light emitting elements may be LEDs, OLEDs, an electrophoretic display (EPD), an LCD, or electronic ink (E-ink).

According to various embodiments, other various components than the display may be configured. For example, a touch panel, a (digital) pen sensor, a key, or an ultrasonic input device may be included. The touch panel may use at least one of capacitive, resistive, infrared, or ultrasonic methods. Further, the touch panel may further include a control circuit. The touch panel may further include a tactile layer and may provide a user with a tactile reaction. The (digital) pen sensor may include, e.g., a part of a touch panel or a separate sheet for recognition. The key may include e.g., a physical button, optical key or keypad. The ultrasonic input device may sense an ultrasonic wave generated from an input tool through a microphone (e.g., a microphone) to identify data corresponding to the sensed ultrasonic wave. As another example, the display device may include a touchscreen and may receive, e.g., a touch, gesture, or proximity using an electronic pen or a body portion of the user or inputs through a hovering sensor.

According to various embodiments, the printed circuit board 450 may be disposed over the first area 411, the second area 412, and the third area 413 of the base 410 to be able to electrically connect the display device 440 and the control module 480. Connectors may be provided at both ends of the printed circuit board 450 to couple with the display device 440 and the control module 480.

According to various embodiments, the printed circuit board 450 may be a flexible printed circuit board and may include straight parts disposed in the first area 411 and the second area 412 and a curved part disposed in the third area 413. The printed circuit board 450 may include at least one signal line which may include, e.g., a power line, a ground line, and digital and analog signal lines. The specific configuration of the printed circuit board 450 is described below.

According to various embodiments, at least portions of the second cradle 470, the antenna module 490, and the printed circuit board 450 may be stacked on one surface of the second area 412 of the base 410. The second cradle 470 may be injection-molded to support the overall second surface (the second surface 312 of FIG. 3) of the accessory device 400 in a shape corresponding to the second area 412 of the base 410.

The second cradle 470 may have a cavity 470a corresponding to the shape of the electronic device to substantially seat the electronic device (e.g., the electronic device 101 of FIG. 2) and at least one hole 470b to expose the camera and/or flash disposed on the rear surface of the electronic device 101 to the outside.

According to various embodiments, the antenna module 490 may be disposed in the middle of the second cradle 470 to be electrically connected with the control module 480 disposed in the second area 412 and to transmit or receive communication signals with the display device 440 and the electronic device 101. The antenna module 490 may include a plurality of antennas (e.g., the first antenna 331 and second antenna 332 of FIG. 3).

According to various embodiments, the first antenna 331 may receive an authentication request signal to perform authentication between the electronic device (e.g., the electronic device 101 of FIG. 2) and the accessory device 400 from the electronic device 101. As another example, the first antenna 331 may transfer a signal of, e.g., radio frequency (RF) containing a response as an event occurs in the accessory device 400 to the electronic device 101. For example, the first antenna 331 may be designed to have the same frequency band as the frequency of the NFC antenna (e.g., the antenna 182 of FIG. 2) of the electronic device 101.

According to various embodiments, the second antenna 332 may receive signals of, e.g., radio frequency (RF), from the electronic device 101. The second antenna 332 may be implemented to have a similar form to the NEC antenna of the electronic device 101. For example, the second antenna 332 may be implemented to have a ring shape. According to an embodiment, the second antenna 332 may be designed to have a particular frequency band to minimize frequency shifting of signals by coupling with the NFC antenna of the electronic device 101 when the electronic device 101 and the accessory device 400 are coupled together. For example, the particular frequency band may be set to be any frequency band to minimize resonance frequency shifting by coupling with the NFC antenna of the electronic device 101.

According to various embodiments, the electronic device 101 and the accessory device 400 may perform operations using modulation (e.g., type S protocol) to prevent the electronic device 101 from recognizing the first antenna 331 and second antenna 332 as a common NFC tag (or NFC antenna). For example, upon detecting an external NFC tag, the electronic device 101 may perform operations with the external NFC tag using an NFC standard protocol (e.g., type A, B, or F protocol). If the accessory device 400 is coupled, the electronic device 101 may sense the sensing member provided in the accessory device 400 and perform operations with the accessory device 400 using a particular NEC protocol (e.g., type S protocol) different from the NFC standard protocol.

Thus, since the electronic device 101 performs operations using a protocol different from the external NFC tag and the accessory device 400, malfunctions of the accessory device 400 may be reduced. Further, since there is no change in RF field of the accessory device 400 after the accessory device 400 is coupled to the electronic device 101, the electronic device 101 may not perform the operation for recognizing the NFC tag.

According to various embodiments, a plate 460 corresponding to the shape of the second cradle 470 may be disposed inside the cavity 470a of the second cradle 470 to prevent exposure of the antenna module 490 to the outside. The plate 460 may be part directly contacting the electronic device 101 and may be treated with leather, fabric, and/or plastic.

Hereinafter, the structure of the flexible printed circuit board is described.

Figure 6A:
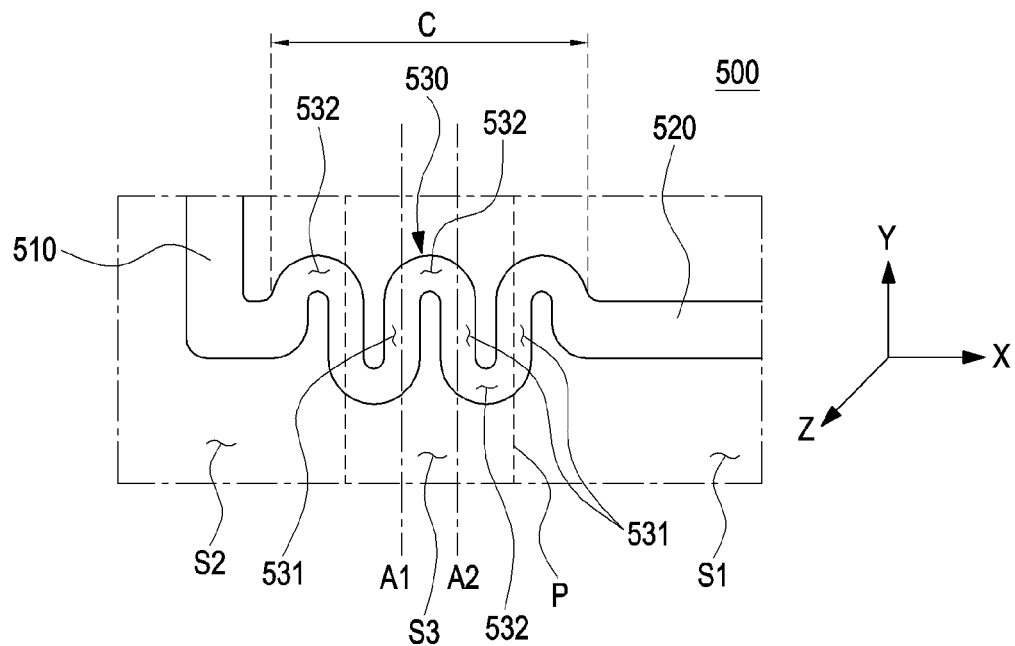
FIG. 6A is a plan view illustrating a flexible printed circuit board 500 including a bending structure C according to various embodiments of the present invention.
Figure 6B:
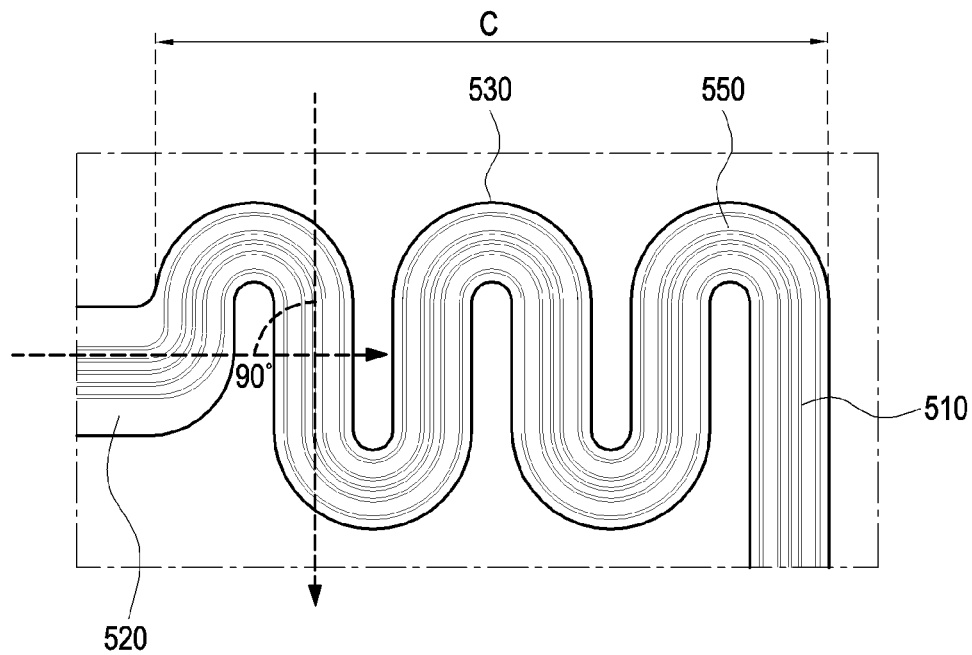
FIG. 6B is a see-through view illustrating a flexible printed circuit board 500 including the internal signal line FIG. 6A according to various embodiments of the present invention.

FIG. 6A is a plan view illustrating a flexible printed circuit board 500 including a bending structure C according to various embodiments of the present invention. FIG. 6B is a see-through view illustrating a flexible printed circuit board 500 including the internal signal line FIG. 6A according to various embodiments of the present invention.

In the three-axis rectangular coordinate system as shown in FIG. 6A, 'X,' 'Y,' and 'Z,' respectively, may denote the width, length, and thickness direction of the accessory device 400. Further, according to an embodiment of the present invention, 'X' may denote a first direction (X), 'Y' may denote a second direction (Y), and 'Z' may denote a third direction (Z).

Referring to FIG. 6A, the flexible printed circuit board 500 disposed in the accessory device may include a first portion 510 disposed in a first area S1, a second portion 520 disposed in a second area S2, and a third portion 530 disposed in a third area S3.

According to various embodiments, the first portion 510 disposed in the first area S1 may mostly be designed to have a plate-shaped straight structure. As another example, a portion of the first portion 510 which is adjacent to the third area S3 may have a bending structure C. For example, the first portion 510 connected from the display device (e.g., the display device 440 of FIG. 5) may extend in the second direction Y, and at least part of its end may be bent and extend to the third portion 530 (the first direction X) of the third area S3.

According to various embodiments, the third portion 530 disposed in the third area S3 may include a wave shape with multiple bends. The third area S3 may be folded as the accessory device folds on virtual border lines P in the lengthwise direction and, thus, the printed circuit board 500 disposed in the third area S3 may be folded. For example, the second and third areas S2 and S3 may be folded on the virtual border lines P with respect to the first area S1, and folding lines A1 and A2, partially bent, may be formed in the third area S3. The bending structure C of the printed circuit board 500 disposed in the third area S3 may be bent in, e.g., the first direction X, second direction Y, and/or third direction Z.

According to various embodiments, the third area S3 may have at least one virtual folding lines A1 and A2 which face in the second direction Y to be bent in the thickness direction, and the printed circuit board 500 may include a plurality of lines 531 disposed in parallel with the virtual folding lines A1 and A2. Since the plurality of lines 531 are substantially parallel with the direction in which stress is produced by the folding of the accessory device, the area in which the printed circuit board abuts with respect to the folding lines may be increased, thus reducing the risk of being open-circuited.

As another example, a plurality of bends 532 extending from the lines 531 may be included between the plurality of lines 531. For example, the bends 532 may be shaped in a semi-annular structure to form at least part of a ring shape. Since the plurality of bends 532 are arranged in a structure corresponding to the direction (e.g., the first direction X or third direction Z) along which stress is produced by twists occurring in different directions from the virtual folding lines A1 and A2 when the accessory device is folded, the area in which the printed circuit board is folded may be increased, thus reducing the risk of being open-circuited.

The second portion 520 disposed in the second area S2 may mostly be designed to have a plate-shaped straight structure. As another example, a portion of the second portion 520 which is adjacent to the third area S3 may have a bending structure C. For example, the second portion 520 connected from the control module (e.g., the control module 480 of FIG. 5) may extend in the first direction X, and at least part of its end may be bent and extend to the third portion 530 of the third area S3.

According to an embodiment of the present invention, the printed circuit board 500 including the bending structure C may be designed in the third area S3 where the accessory device is folded and may be extendable in 3D directions (the first direction X, the second direction Y, and/or the third direction Z). For example, the plurality of lines 531 may be configured to cross each other in the second direction +Y or −Y in the bending structure C. Accordingly, corresponding to the extension of the accessory device configured with fabric or leather, the printed circuit board 500 may structurally correspond, which may prevent the printed circuit board 500 from being open-circuited and thus extend the lifespan of the accessory device.

Referring to FIG. 6B, at least one of the signal lines 550 may be identified which are arranged in the flexible printed circuit board 500 of FIG. 6A. Signal lines, such as power or ground GND may be arranged in the flexible printed circuit board 500, and the signal lines 550 may be designed to correspond to the shape of the printed circuit board 500. For example, the signal lines 550 may be configured of a plurality of lines along the lengthwise direction of the printed circuit board 500 and may be designed to be different depending on each area.

According to various embodiments, at least one signal line formed in the first portion 510 or the second portion 520 and at least one signal line formed in the third portion 530 may be arranged to at least partially be orthogonal to each other.

According to various embodiments, at least some of the signal lines 550 designed in the first portion 510 of the printed circuit board 500 disposed in the first area S1 may be shaped as straight lines facing in the first direction X or second direction Y, and their ends may have a curved shape including a bent structure. At least some of the signal lines 550 designed in the second portion 520 of the printed circuit board 500 disposed in the second area S2 may be shaped as straight lines facing in the first direction X or second direction Y, and their ends may have a curved shape including a bent structure.

Since the signal lines 550 designed (line parts) in the third portion 530 disposed in the third area S3 are arranged to be substantially parallel with the direction in which stress is produced by the folding of the accessory device, the area which structurally abuts the third area S3 may be increased. For example, since the signal lines 550 designed in the third portion 530 are arranged to correspond to the direction (e.g., the first direction X and/or the third direction Z) in which stress is produced by twists in different directions from the virtual folding line or in the direction (e.g., the second direction Y) parallel with the virtual folding line, the area which structurally abuts the third area S3 may be increased.

According to an embodiment of the present invention, the signal lines 550 including the bending structure C may be designed in the third area where the accessory device 500 is folded and may be extendable in 3D directions (the first direction X, the second direction Y, and/or the third direction Z). Accordingly, corresponding to the extension of the accessory device configured with fabric or leather, the signal lines 550 may structurally correspond, which may prevent the signal lines 550 from being disconnected and thus extend the lifespan of the accessory device.

Figure 7:
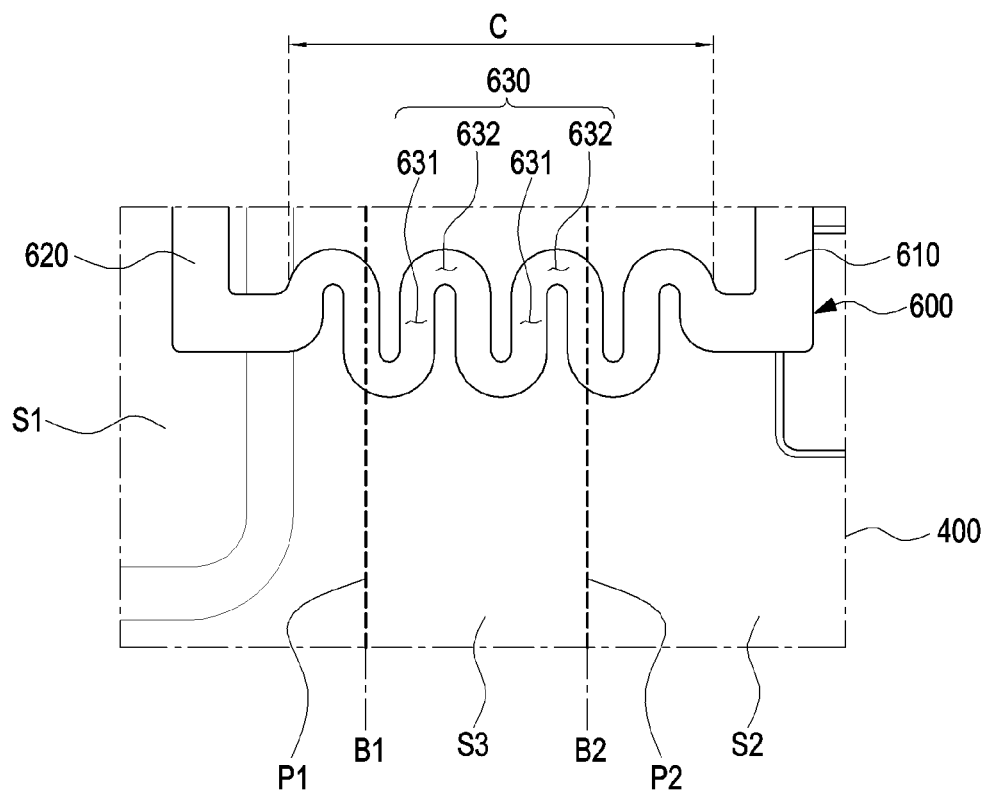
FIG. 7 is a see-through view illustrating a structure in which a flexible printed circuit board 600 with a bending structure C is disposed inside an accessory device 400 according to various embodiments of the present invention.

FIG. 7 is a see-through view illustrating a structure in which a flexible printed circuit board 600 with a bending structure C is disposed inside an accessory device 400 according to various embodiments of the present invention.

Referring to FIG. 7, the flexible printed circuit board 600 may be disposed to cross the first area S1, the third area S3, and the second area S2. The flexible printed circuit board 600 may be designed to include a bending structure C in the third area S3 and its adjacent area.

According to various embodiments, the third portion 630 disposed in the third area S3 may include a plurality of lines 631 and bends 632 arranged therebetween, and the ends of the first portion 610 and/or the second portion 620 extending from an end of the third portion 630 may include at least one line and bend.

According to various embodiments, the accessory device 400 may receive stress mostly at the first border P1 where the third area S3 abuts the first area S1 and the second border P2 where the third area S3 abuts the second area S2. For example, the second and third areas S2 and S3 may be folded on the first border P1 with respect to the first area S1 and, thus, stress may concentrate on the first border P1. A portion of the printed circuit board 600 which is disposed at the first border P1 may be disposed in the lengthwise direction to be parallel with a first virtual folding line B1 which is formed in the lengthwise direction. As another example, at least one signal line designed in the printed circuit board 600 may be disposed in the lengthwise direction to be parallel with the first virtual folding line B1. As another example, a portion of the printed circuit board 600 which is disposed at the second border P2 may be disposed in the lengthwise direction to be parallel with a second virtual folding line B2 which is formed in the lengthwise direction. As another example, at least one signal line designed in the printed circuit board 600 may be disposed in the lengthwise direction to be parallel with the second virtual folding line B2.

According to various embodiments, the portions of the printed circuit board 600 which are disposed at the first border P1 and the second border P2 where continuous stress and/or the largest tension occurs may be designed to be parallel with the direction in which stress is exerted to have flexibility, thereby suppressing disconnection of signal lines in the printed circuit board.

Hereinafter, what has been described above in connection with FIGS. 5A and 5B may apply to the specific bending structure.

Figure 8A:
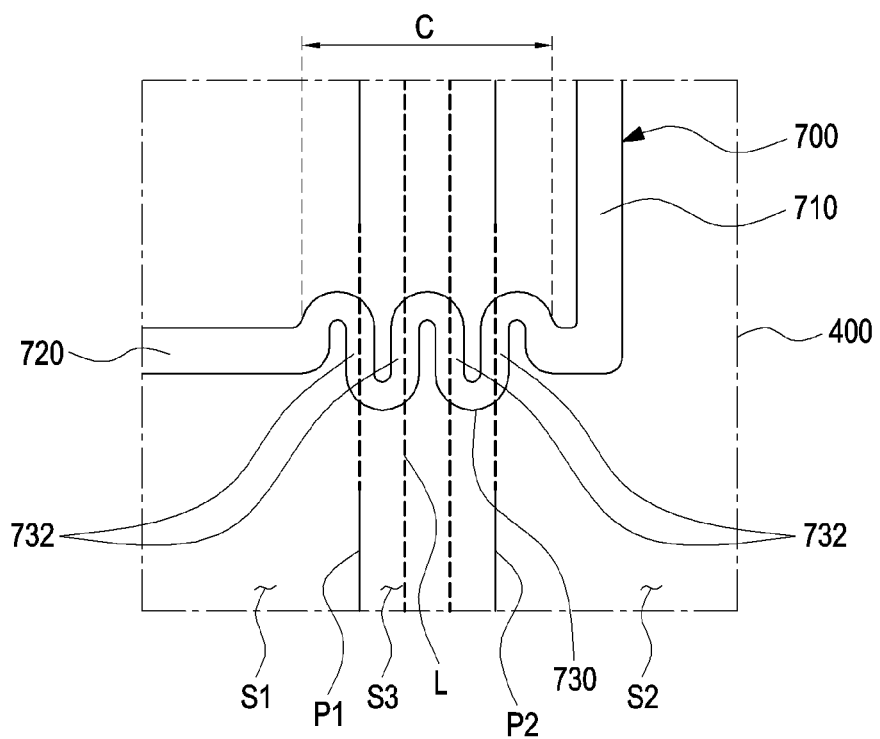
FIG. 8A is a view illustrating a bending structure disposed to overlap a guideline L according to an embodiment of the present invention.
Figure 8B:
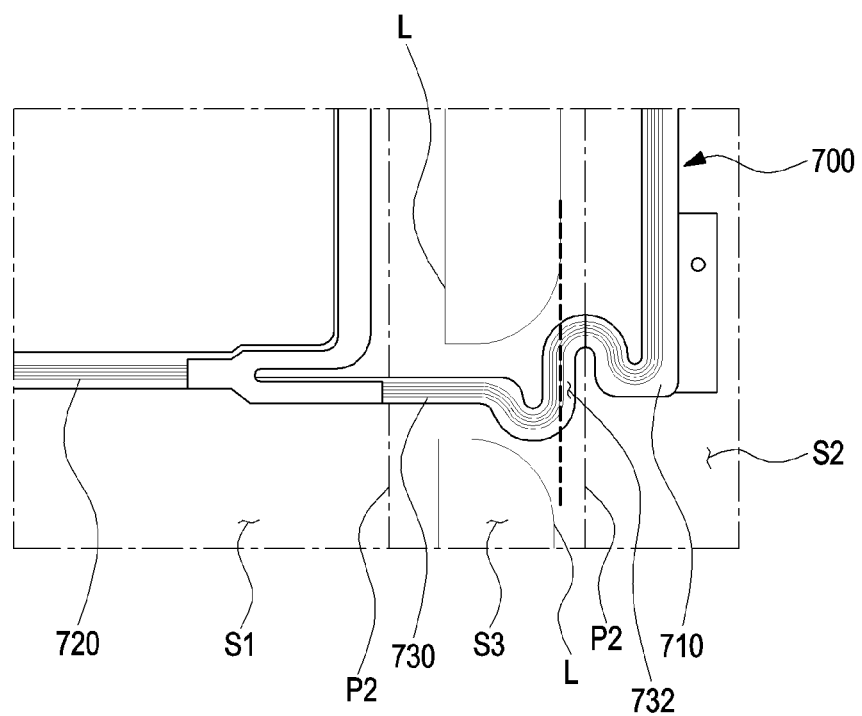
FIG. 8B is a view illustrating a bending structure disposed not to overlap a guideline L according to an embodiment of the present invention.

FIG. 8 is a see-through view illustrating an arrangement of a guideline (branding iron) L and a flexible printed circuit board 700 including a bending structure according to various embodiments of the present invention. FIG. 8A is a view illustrating a bending structure disposed to overlap a guideline L according to an embodiment of the present invention, and FIG. 8B is a view illustrating a bending structure disposed not to overlap a guideline L according to an embodiment of the present invention.

Referring to FIG. 8A, the flexible printed circuit board 700 may be disposed to cross the first area S1, the third area S3, and the second area S2. The flexible printed circuit board 700 may be designed to include a bending structure C in the third area S3 and its adjacent area.

According to various embodiments, the accessory device 400 may have a guideline (branding iron) L in the third area S3 to allow the second area S2 to fold or unfold relatively flexibly on the first area S1. There may be a plurality of guidelines L to be parallel with the direction of the folding line disposed in the lengthwise direction of the third area S3.

According to various embodiments, the third portion 730 disposed in the third area S3 of the printed circuit board 700 may include a plurality of lines 732 and bends arranged therebetween, and the ends of the first portion 710 and/or the second portion 720 extending from an end of the third portion 730 may include at least one line and bend.

According to various embodiments, the plurality of lines 732 of the third portion 730 may be designed to be parallel with the guidelines L, and the plurality of guidelines L are designed to be relatively narrower in thickness than the lines of the printed circuit board 700 and may thus be arranged between the lines.

According to various embodiments, the guide lines L disposed to be parallel with the plurality of lines 732 in the third portion 730 may be disposed on the first border P1 where the third area S3 abuts the first area S1 and the second border P2 where the third area S3 abuts the second area S2 and may be disposed to overlap the folding line between the first border P1 and the second border P2.

According to an embodiment of the present invention, although four line parts 732 and the guide lines L disposed in the line parts in the third area S3 are shown, embodiments of the present invention are not limited thereto, and various changes in shape may be made to the number of lines in the bending structure of the printed circuit board, the inter-line width, or length depending on the number of guide lines.

Referring to FIG. 8B, the flexible printed circuit board 700 may be disposed to cross the first area S1, the third area S3, and the second area S2. The flexible printed circuit board 700 may be designed to include a bending structure C in the third area S3 and its adjacent area.

According to various embodiments, the accessory device 400 may have a guideline (branding iron) L in the third area S3 to allow the second area S2 to fold or unfold relatively flexibly on the first area S1. There may be a plurality of guidelines L to be parallel with the direction of the folding line disposed in the lengthwise direction of the third area S3.

According to various embodiments, unlike in FIG. 8A, the guidelines L may be disposed not to overlap the third portion 730 disposed in the third area S3 of the printed circuit board 700. For example, the guidelines L may be disposed on both sides of where the plurality of 730 is disposed, and the printed circuit board 700 may be disposed in the third area 730 where no guideline L is formed.

According to an embodiment, the plurality of lines 732 of the third portion 730 may be designed to be parallel with the guidelines L, and the plurality of lines 732 may be seated aligned with the virtual folding lines.

Hereinafter, what has been described above in connection with FIGS. 5A and 5B may apply to the specific bending structure.

Figure 9:
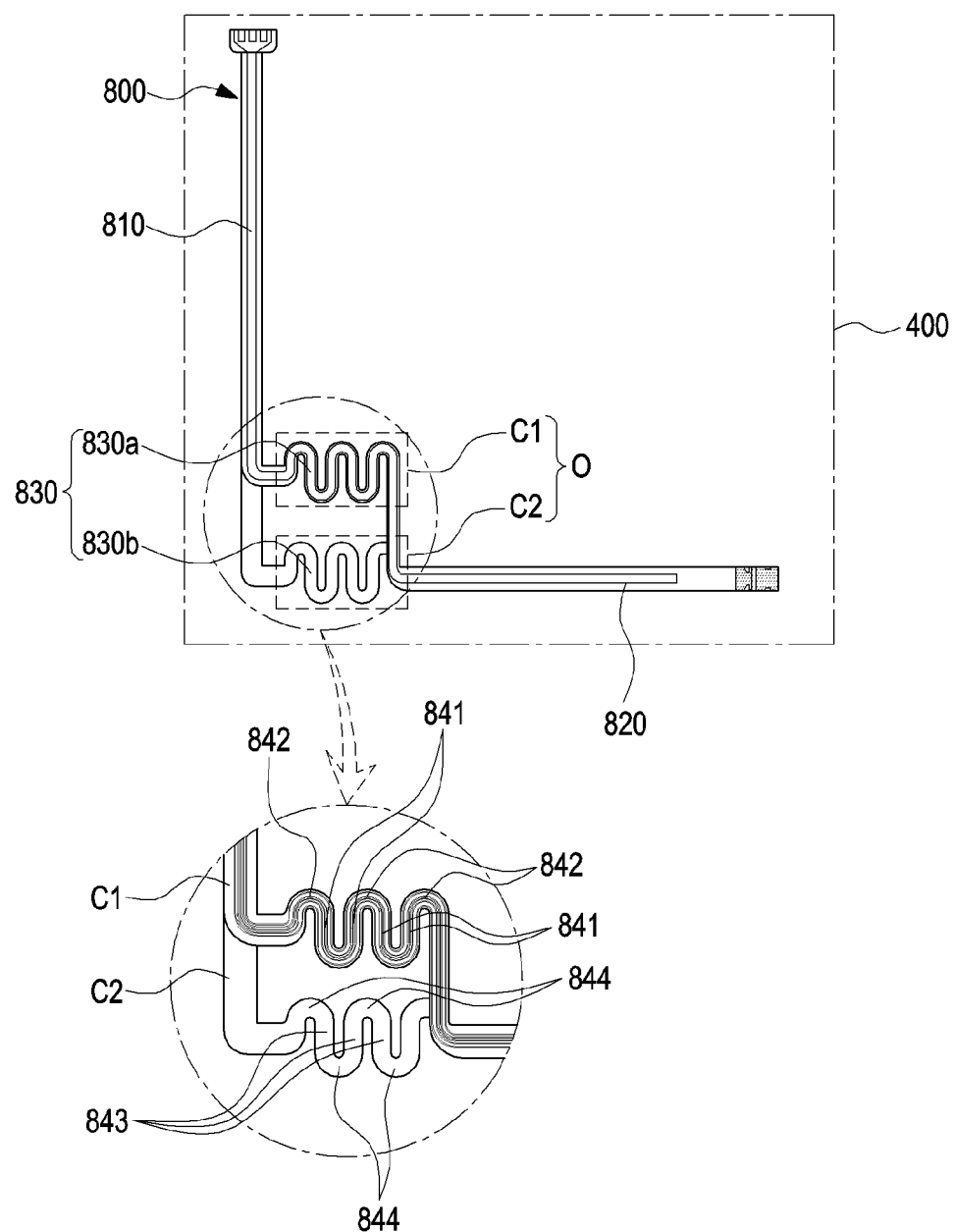
FIG. 9 is a concept view illustrating a plurality of printed circuit boards 800 with a bending structure C according to various embodiments of the present invention.

FIG. 9 is a concept view illustrating a plurality of printed circuit boards 800 with a bending structure C according to various embodiments of the present invention.

Referring to FIG. 9, the flexible printed circuit board 800 disposed in the accessory device 400 may include a first portion 810 disposed in a first area S1 (the first area S1 of FIG. 6A), a second portion 820 disposed in a second area S2 (the second area S2 of FIG. 6A), and a third portion 830 disposed in a third area S3 (the third area S3 of FIG. 6A).

According to various embodiments, the flexible printed circuit board 800 may be branched into a plurality of lines which are spaced apart at a predetermined interval and perform the same function in some areas. The some areas (where the bending structure C is disposed) may be the third area S3 and its adjacent area and may be the third portion 830 disposed in the third area S3 and the first portion 810 and second portion 820 disposed in the adjacent area.

According to various embodiments, the branched lines of the printed circuit board 800 may be formed as a single line in the other areas than the some areas. For example, two bending structures C branched from an end of the first area S1 may be merged back into one in the second area S2 and extend towards, the control module of the second area S2.

According to various embodiments, the branched bending structures C may include a first bending structure C1 and a second bending structure C2 spaced apart from the first bending structure C1 under the first bending structure C1. The first bending structure C1 and the second bending structure C2 may be prepared to be symmetrical with each other in the same shape. Thus, the same design of signal lines may be formed in the first bending structure C1 and the second bending structure C2.

According to various embodiments, the first bending structure C1 disposed in the third area and its adjacent area may include a plurality of lines 841 disposed to be parallel with the above-described virtual folding lines (the virtual folding lines A1 and A2 of FIG. 6A). Since the plurality of lines 841 are substantially parallel with the direction in which stress is produced by the folding of the accessory device 400, the area which structurally abuts one surface of the accessory device 400 may increase. As another example, the first bending structure C1 disposed in the third area and its adjacent area may include a plurality of bends 842. The plurality of bends 842 may be arranged between the plurality of lines 841. For example, the bends 842 may be shaped in a semi-annular structure. Since the plurality of bends 842 are arranged in the structure corresponding to a perpendicular direction and/or the direction in which stress is produced by twists in different directions from the virtual folding lines (the virtual folding lines A1 and A2 of FIG. 6A) occurring when the accessory device folds, they may structurally have flexibility.

According to various embodiments, the second bending structure C2 disposed in the third area and its adjacent area may include a plurality of lines 843 disposed to be parallel with the virtual folding lines (the virtual folding lines A1 and A2 of FIG. 6A). Since the plurality of lines are arranged to be substantially parallel with the direction in which stress is produced by the folding of the accessory device, they may structurally have flexibility. As another example, the second bending structure C2 disposed in the third area and its adjacent area may include a plurality of bends 844. The plurality of bends 844 may be arranged between the plurality of lines 843. For example, the bends 842 may be shaped in a semi-annular structure. Since the plurality of bends 842 are arranged in the structure corresponding to a perpendicular direction and/or the direction in which stress is produced by twists in different directions from the virtual folding lines (the virtual folding lines A1 and A2 of FIG. 6A) occurring when the accessory device folds, they may structurally have flexibility.

According to various embodiments, although the bending structures C1 and C2 are shown to have the first bending structure C1 and the second bending structure C2, embodiments of the present invention are not limited thereto and a plurality of bending structures, a third bending structure and a fourth bending structure with the same signal line may be added. The printed circuit board is designed with a plurality of branched bending structures and, although one line is disconnected, normal signal operations may be performed with the remaining lines.

Figure 10:
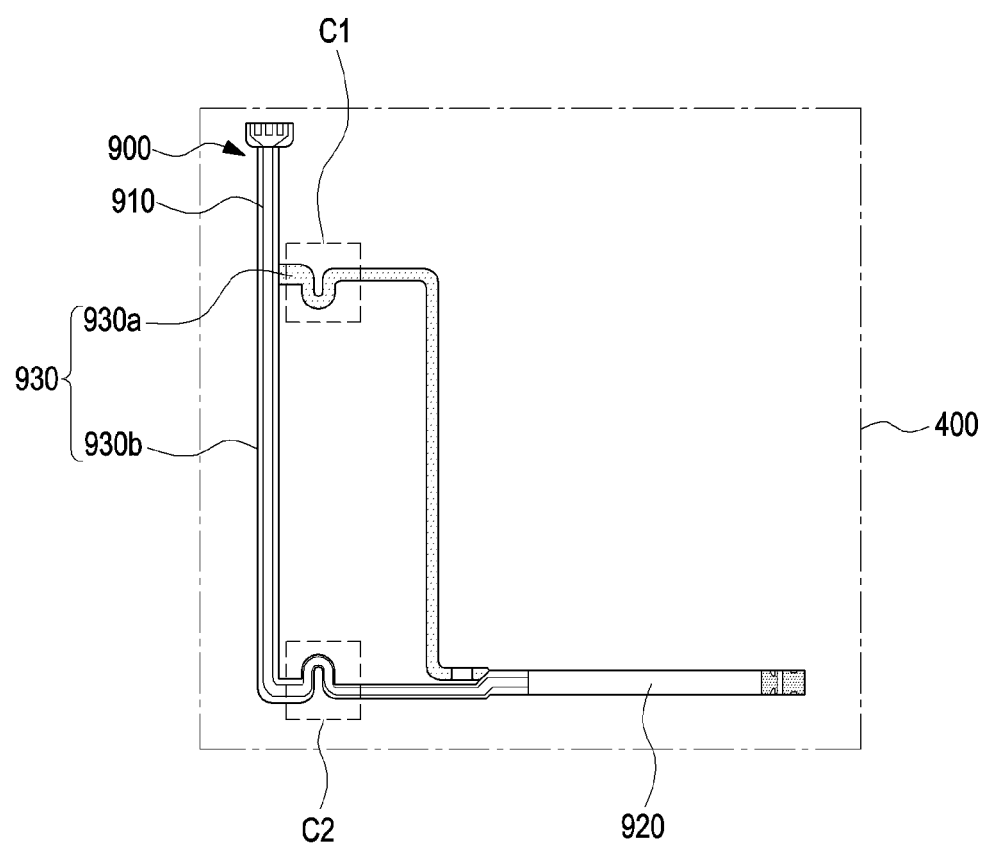
FIG. 10 is a concept view illustrating a plurality of printed circuit boards 900 with a bending structure C according to various embodiments of the present invention.

FIG. 10 is a concept view illustrating a plurality of printed circuit boards 900 with a bending structure C according to various embodiments of the present invention.

Referring to FIG. 10, the flexible printed circuit board 900 disposed in the accessory device 400 may include a first portion 910 disposed in a first area S1 (the first area S1 of FIG. 6A), a second portion 920 disposed in a second area S2 (the second area S2 of FIG. 6A), and a third portion 930 disposed in a third area S3 (the third area S3 of FIG. 6A).

According to various embodiments, the flexible printed circuit board 900 may be branched into a plurality of lines which are spaced apart at a predetermined interval and perform the same function in some areas. The some areas (where the bending structure C is disposed) may be the third area S3 and its adjacent area and may be the third portion 930 disposed in the third area S3 and the first portion 910 and second portion 920 disposed in the adjacent area.

According to various embodiments, the branched bending structures C may include a first bending structure C1 and a second bending structure C2 spaced apart from the first bending structure C1 under the first bending structure C1. The first bending structure C1 and the second bending structure C2 may be prepared to be asymmetrical with each other in different shapes. The first bending structure C1 and the second bending structure C2 may have signal lines designed therein to perform the same function.

According to various embodiments, the spacing between the first bending structure C1 and the second bending structure C2 may be relatively large as compared with the bending structure of FIG. 9, For example, the first bending structure C1 may be disposed adjacent the connector of the first portion 910 of the printed circuit board, and the second bending structure C2 may be disposed on the same line as the connector of the second portion 920 of the printed circuit board. In a case where the first bending structure C1 and the second bending structure C2 are positioned adjacent each other, the areas where stress is exerted by the folding of the accessory device 400 may overlap each other and thus similar stress may simultaneously be applied to the first bending stricture C1 and the second bending structure C2. According to an embodiment, in a case where the first bending structure C1 and the second bending structure C2 are disposed to be away from each other, different stress may be applied thereto and, although one line is disconnected, the normal signal operations may be performed with the remaining lines.

According to various embodiments, the first bending structure C1 and the second bending structure C2 may have different numbers of bends and the bends may be arranged in different shapes.

According to various embodiments, although the bending structures are shown to have the first bending structure C1 and the second bending structure C2, embodiments of the present invention are not limited thereto and a plurality of bending structures, e.g., a third bending structure and a fourth bending structure with the same signal line may be added.

What has been described above in connection with FIG. 9 may apply to the details of each bending structure C.

Figure 11:
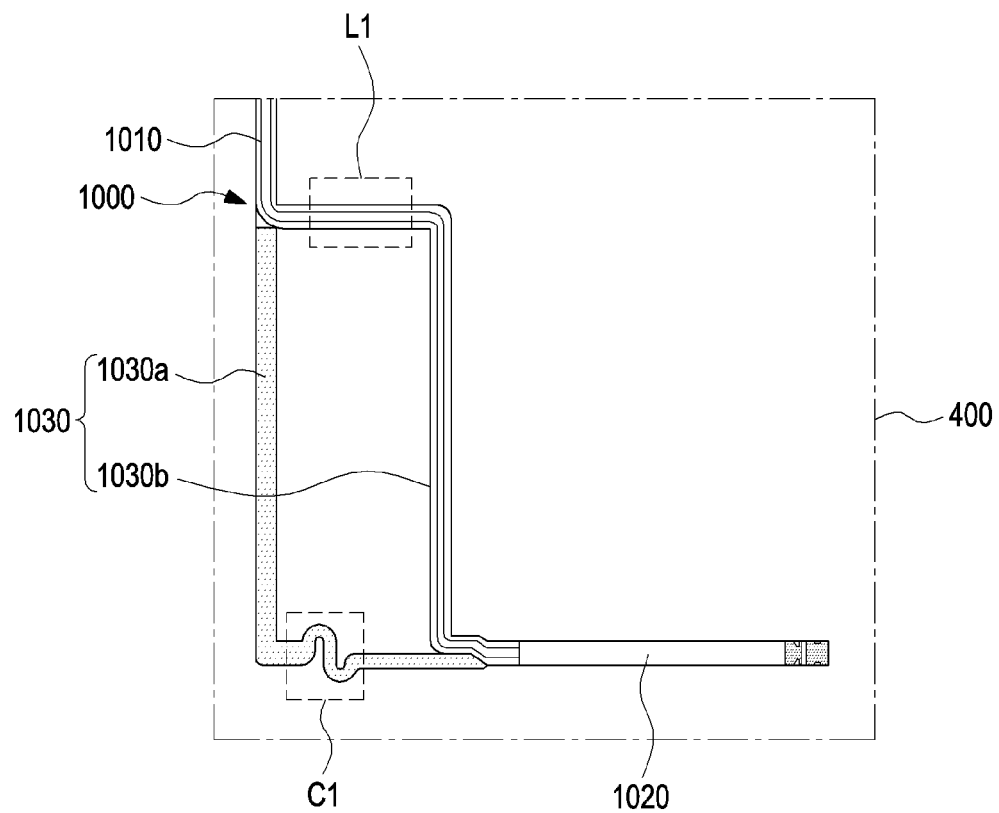
FIG. 11 is a concept view illustrating a plurality of printed circuit boards 1000 some of which have a bending structure C according to various embodiments of the present invention.

FIG. 11 is a concept view illustrating a plurality of printed circuit boards 1000 some of which have a bending structure C according to various embodiments of the present invention.

Referring to FIG. 11, the flexible printed circuit board 1000 disposed in the accessory device 400 may include a first portion 1010 disposed in a first area S1 (the first area S1 of FIG. 6A), a second portion 1020 disposed in a second area S2 (the second area S2 of FIG. 6A), and a third portion 1030 disposed in a third area S3 (the third area S3 of FIG. 6A).

According to various embodiments, the flexible printed circuit board 1000 may be branched into a plurality of lines which are spaced apart at a predetermined interval and perform the same function in some areas. The some areas (where the bending structure C is disposed) may be the third area S3 and its adjacent area and may be the third portion 1030 disposed in the third area S3 and the first portion 1010 and second portion 1020 disposed in the adjacent area.

According to various embodiments, the plurality of branched lines may include a bending structure C1 and a line L1 which is a single line with no bending structure. The same signal line may be designed in the bending structure C1 and the single line L1. The bending structure C1 may be disposed in the center of the third area where stress concentrates, and the single line may be disposed in an end area of the third area where relatively less stress is applied.

According to various embodiments, although the printed circuit board 1000 is configured with one bending structure C1 and one single line L1, embodiments of the present invention are not limited thereto, and a plurality of single lines and bending structures with the same signal line may be added. The printed circuit board is designed with a plurality of branched bending structures and, although one line is disconnected, normal signal operations may be performed with the remaining lines.

What has been described above in connection with FIG. 5 may apply to the details of each bending structure C1.

According to various embodiments of the present invention, an accessory device for covering an electronic device comprises a cover part including a front cover configured to cover at least part of a front surface of the electronic device, a rear cover configured to cover at least part of a rear surface of the electronic device, and a side part connecting the front cover and the rear cover, a first component disposed on the front cover, a second component disposed inside the rear cover, and a printed circuit board electrically connected with the first component and the second component and disposed from the front cover through the side part to the rear cover, wherein at least a portion of the printed circuit board may include a bending structure in a folding area of the cover part corresponding to a movement of the front cover.

According to various embodiments, the bending structure of the printed circuit board may be disposed in the side part of the cover part and its adjacent area. A portion of the bending structure may be disposed to be parallel with at least one virtual folding line parallel with a lengthwise direction of the cover part.

According to an embodiment, the printed circuit board may include a first portion positioned in the front cover, a second portion positioned in the side part and extending from the first portion, and a third portion positioned in the rear cover and extending from the second portion. The bending structure may be formed in a part of the first portion or the second portion which is positioned at least adjacent the third portion.

According to various embodiments, the bending structure may include a plurality of bends in a curved or bent shape and a plurality of lines arranged between the bends and parallel with a direction of a virtual folding line disposed in a lengthwise direction of the side part.

According to various embodiments, the bending structure may include a waveform shape in which a pattern of the bends is repeatedly disposed.

According to various embodiments, the printed circuit board may include a flexible printed circuit board. At least one signal line in a shape corresponding to the bending structure may be disposed in the flexible printed circuit board.

According to various embodiments, some of one or more signal lines formed in the first portion or the second portion may be orthogonal to some of one or more signal lines formed in the third portion.

According to various embodiments, the first component may include an output device, and the second component may include a device configured to receive (or process) a signal from another electronic device. The printed circuit board may connect power or a signal received from the second component to the first component.

According to various embodiments, the first component may include at least one of a display device including an input device, a touch panel, a (digital) pen sensor, a key, or an ultrasonic device.

According to various embodiments, the printed circuit board may include a flexible printed circuit board. Connectors may be included at both ends of the flexible printed circuit board and be electrically connected with the first component or the second component. A portion of the flexible printed circuit board may be branched into a plurality of pieces in the side part or an adjacent area of the side part.

According to various embodiments, a plurality of branched signal lines corresponding to the branched shape may be included in the flexible printed circuit board branched into the plurality of pieces. The branched printed circuit board may include a first bending structure and a second bending structure spaced apart from the first bending structure under the first bending structure.

According to various embodiments, the first bending structure and the second bending structure may be disposed to be symmetrical with each other.

According to various embodiments, the first bending structure and the second bending structure may be disposed to be asymmetrical with each other.

According to various embodiments, a plurality of branched signal lines corresponding to the branched shape may be included in the printed circuit board branched into the plurality of pieces, and one of the branched pieces may include a bending structure, and the other may be configured in a single-line shape.

According to various embodiments of the present invention, an accessory device for covering an electronic device comprises a cover part including a front cover configured to cover at least part of a front surface of the electronic device, a rear cover configured to cover at least part of a rear surface of the electronic device, and a side part extending from the front cover and connecting the rear cover and a printed circuit board disposed inside the cover part and formed from the front cover through the side part to the rear cover, wherein a length of the printed circuit board positioned in the side part may be larger than a width of the side part.

According to various embodiments, the cover part may include a base including a first area and a second area rotating about the first area through a third area, a first cradle disposed in the first area of the base and supporting the first area, and a second cradle disposed in the second area of the base and having a cavity where a rear surface of the electronic device is seated.

According to various embodiments, the third area of the base may include a virtual border line corresponding to a lengthwise direction of the cover part. The base may include at least one of fabric, leather, or plastic.

According to various embodiments, a first border between the first area and the third area of the base and a second border between the third area and the second area may be formed in a lengthwise direction of the base. At least one line of the bending structure of the printed circuit board may be disposed to overlap the first border or the second border.

According to various embodiments, the signal line disposed in the at least one line of the printed circuit board may be disposed to overlap the first border or the second border.

According to various embodiments, the base may include a plurality of guidelines (branding iron) corresponding to the virtual folding line formed in the third area. A direction of the plurality of guidelines and some direction of the bending structure of the printed circuit board may be parallel with each other.

According to various embodiments, the plurality of guidelines may be formed in the bending structure of the printed circuit board when viewing the third area.

According to various embodiments of the present invention, an electronic device including an accessory device comprises a first electronic device including a display, a cover part including a front cover configured to cover at least part of a front surface of the display of the first electronic device, a rear cover configured to cover at least part of a rear surface of the first electronic device, and a side part surrounding a portion of a space between the front cover and the rear cover, and a printed circuit board disposed from the front cover through the side part to the rear cover, wherein the front cover of the cover part may be rotated on the rear cover through a virtual folding line formed in the side part to open or close the display, and wherein at least part of the printed circuit board is disposed to be parallel with a direction of stress applied to the side part along the virtual folding line.

The invention claimed is:

1. An accessory device for covering an electronic device, the accessory device comprising:
   a cover part including:
      a front cover configured to cover at least part of a front surface of the electronic device,
      a rear cover configured to cover at least part of a rear surface of the electronic device, and
      a side part connecting the front cover and the rear cover;
   a first component disposed on the front cover;
   a second component disposed inside the rear cover; and
   a printed circuit board electrically connected with the first component and the second component and disposed from the front cover through the side part to the rear cover, wherein at least a portion of the printed circuit board includes a bending structure in a folding area of the cover part corresponding to a movement of the front cover, wherein at least one portion of the bending structure of the printed circuit board is arranged on an inner surface of the side part, and wherein the at least one portion of the bending structure includes a plurality of bends in a curved or bent shape and a plurality of lines arranged between the bends and parallel with a direction of a virtual folding line disposed in a lengthwise direction of the side part.

2. The accessory device of claim 1, wherein the bending structure of the printed circuit board is disposed in the side part of the cover part and adjacent area of the side part.

3. The accessory device of claim 2, wherein:
the printed circuit board includes a flexible printed circuit board,
connectors are included at both ends of the flexible printed circuit board and are electrically connected with the first component or the second component,
a portion of the flexible printed circuit board is branched into a plurality of pieces in the side part or an adjacent area of the side part, wherein a plurality of branched signal lines corresponding to a branched shape are included in the flexible printed circuit board and branched into the plurality of pieces, and
the printed circuit board includes a first bending structure and a second bending structure spaced apart from the first bending structure under the first bending structure.

4. The accessory device of claim 1, wherein:
the printed circuit board includes:
a first portion positioned in the front cover,
a second portion positioned in the side part and extending from the first portion, and
a third portion positioned in the rear cover and extending from the second portion, and
the bending structure is formed in a part of the first portion or the third portion which is positioned at least adjacent the second portion.

5. The accessory device of claim 4, wherein the bending structure includes a waveform shape in which a pattern of bends is repeatedly disposed.

6. The accessory device of claim 4, wherein:
the printed circuit board includes a flexible printed circuit board, and
at least one signal line in a shape corresponding to the bending structure is disposed in the flexible printed circuit board.

7. The accessory device of claim 6, wherein some of one or more signal lines formed in the first portion or the second portion are orthogonal to some of one or more signal lines formed in the third portion.

8. The accessory device of claim 1, wherein:
the first component includes an output device, and the second component includes a device configured to receive or process a signal from another electronic device, and
the printed circuit board connects power or a signal received from the second component to the first component.

9. The accessory device of claim 8, wherein:
a plurality of branched signal lines corresponding to a branched shape are included in a flexible printed circuit board and branched into a plurality of pieces, and
one of the plurality of pieces of the printed circuit board includes the bending structure and others of the plurality of pieces are formed in a single line shape.

10. The accessory device of claim 1, wherein the first component includes at least one of:
a display device including an input device,
a touch panel,
a digital pen sensor,
a key, or
an ultrasonic device.

11. An accessory device for covering an electronic device, the accessory device comprising:
a cover part including:
a front cover configured to cover at least part of a front surface of the electronic device,
a rear cover configured to cover at least part of a rear surface of the electronic device, and
a side part extending from the front cover and connecting the rear cover; and
a printed circuit board disposed inside the cover part and formed from the front cover through the side part to the rear cover,
wherein a length of the printed circuit board positioned in the side part is larger than a width of the side part,
wherein at least one portion of a bending structure of the printed circuit board is arranged on an inner surface of the side part, and
wherein the at least one portion of the bending structure includes a plurality of bends in a curved or bent shape and a plurality of lines arranged between the bends and parallel with a direction of a virtual folding line disposed in a lengthwise direction of the side part.

12. The accessory device of claim 11, wherein the cover part includes:
a base including a first area and a second area rotating about the first area through a third area;
a first cradle disposed in the first area of the base and supporting the first area; and
a second cradle disposed in the second area of the base and having a cavity where a rear surface of the electronic device is seated,
wherein the third area of the base includes a virtual border line corresponding to a lengthwise direction of the cover part, and
wherein the base includes at least one of fabric, leather, or plastic.

13. The accessory device of claim 12, wherein:
a first border between the first area and the third area of the base and a second border between the third area and the second area are formed in a lengthwise direction of the base, and
at least one line of the bending structure of the printed circuit board is disposed to overlap the first border or the second border.

14. The accessory device of claim 12, wherein:
the base includes a plurality of guidelines corresponding to virtual border line formed in the third area, and
a direction of the plurality of guidelines and some direction of the bending structure of the printed circuit board are parallel with each other.

* * * * *